United States Patent [19]
Yun

[11] Patent Number: 6,111,530
[45] Date of Patent: Aug. 29, 2000

[54] METHOD FOR DETECTING DATA OUTPUT BY OPTICAL COUPLER USING ANALOG TO DIGITAL CONVERTER WITH PRESET INITIAL REFERENCE

[75] Inventor: Sung-Hm Yun, Gumi, Rep. of Korea

[73] Assignee: Samsung Electronics Co., Ltd., Rep. of Korea

[21] Appl. No.: 08/877,747

[22] Filed: Jun. 17, 1997

[30] Foreign Application Priority Data

Jun. 17, 1996 [KR] Rep. of Korea ...................... 96-21881

[51] Int. Cl.[7] .............................. H03M 1/00; H03M 1/34; H03K 5/153; H03K 5/22
[52] U.S. Cl. ............................ 341/137; 327/72; 341/158
[58] Field of Search ..................... 341/137, 118, 341/120, 128, 155, 158; 327/72, 387; 382/141

[56] References Cited

U.S. PATENT DOCUMENTS

| | | | |
|---|---|---|---|
| 3,968,487 | 7/1976 | Herring et al. | 341/141 |
| 5,046,158 | 9/1991 | Groen | 341/137 |
| 5,264,849 | 11/1993 | Kondoh et al. | 341/137 |
| 5,377,282 | 12/1994 | Fellows et al. | 327/72 X |
| 5,517,237 | 5/1996 | Cocanour | 348/189 |

*Primary Examiner*—Patrick Wamsley
*Attorney, Agent, or Firm*—Dilworth & Barrese

[57] ABSTRACT

A method for detecting data outputted from an optical coupler is presented comprising the steps of setting a reference recognizing level by inputting the data in an initial state to an A/D converter; recognizing the level of the data in a noninitial state as high if the level of the data at the non-initial state is greater than the reference recognizing level; recognizing level of the data in the non-initial state as low if the level of the data at the non-initial state is less than the reference recognizing level; and setting the level of the data at the non-initial state to equal the reference recognizing level if the level of the data at the non-initial state is recognized as low.

6 Claims, 4 Drawing Sheets

METHOD FOR DETECTING DATA OUTPUT BY OPTICAL COUPLER USING ANALOG TO DIGITAL CONVERTER WITH PRESET INITIAL REFERENCE

BACKGROUND OF THE INVENTION

1. Field of the Invention

The present invention relates to a method for detecting data outputted from an optical coupler, and, in particular, to a method for detecting data outputted from the optical coupler by the use of an analog-to-digital converter.

2. Description of the Related Art

FIG. 1 illustrates a prior art circuit for detecting data outputted from an optical coupler. Through a resistor R2, input signal Vs turns on a light emitting diode within the optical coupler 112, causing the diode to emit light. In response to the light, a photo-transistor within the optical coupler 112 is turned on, providing a ground path to supply voltage Vcc. The optical coupler 112 can thus be turned on or off by the input signal Vs to provide an output signal Vin to a microprocessor unit (MPU) 110.

The MPU 110 detects the level of the signal Vin, and senses whether it is logic high or low based on a predetermined reference level, e.g., 2.5V. The MPU 110 recognizes the level of the inputted signal Vin as a logic high level, if the level is greater than 2.5V. The MPU 110 recognizes the level as a logic low level, if the level is less than 2.5V.

FIG. 2 illustrates in graphic form the detection of data outputted from the prior art optical coupler circuit. The MPU 110 receives the input signal Vin and recognizes a signal Vp corresponding with the signal Vin. The signal Vp conveys the level of the signal Vin outputted from the prior art optical coupler circuit at various points. If the signal Vin at a given point is greater than 2.5V, then the data at that point has a logic high level. If the signal Vin at a given point is less than 2.5V, then the data at that point has a logic low level.

As described above and illustrated by FIGS. 1 and 2, the optical coupler 112 is used for transferring logic information carried by a signal by the use of light instead of electricity. The optical coupler 112 is an optoelectric device that takes advantage of both the digital processing capabilities of electronics and communications capabilities of the optical domain. It is a digital active optical logic device with high and low light-emitting output states corresponding to electrical states of high impedance (low optical output) or low impedance (high optical output). The optical coupler 112 is also used to check whether the input signal Vs exists. If the diode within the optical coupler 112 is turned on, then the signal Vs exists. If the diode is not turned on, then the signal Vs does not exist.

Despite the loss of power in conversions of electrical energy to optical and optical to electrical energy and the imbalances inherent in an optical communication system, transmission of light signals instead of electrical signals have known advantages such as no EMI interference, and large transmission bandwidths.

Nonetheless, the prior art optical coupler circuit suffers from occasional erroneous level detection because Vin outputted from the optical coupler 112 is recognized by the MPU 110 with only one reference level. For example, a logic high Vin which deviates below the reference level at the time of detection, depending on the level of signal Vs and the value of R1, will be recognized as logic zero by the MPU 110. For example, in FIG. 2 the level of signal Vin at point A is recognized as logic zero by the MPU 110 because it is less than the reference level.

Consequently, in accordance with the feature of transferring the signal Vin of the optical coupler 112, the value of the resistor R1 in the optical coupler circuit of the prior art should be changed depending on the application in order to perform stable conversion and transfer operations of signal Vs and have the level of signal Vin correctly recognized by the MPU 110 at all points in the signal.

SUMMARY OF THE INVENTION

It is therefore an object of the present invention to provide a method for detecting data outputted from an optical coupler in the form of an analog signal by the use of an analog-to-digital (A/D) converter.

It is another object of the present invention to provide a method for converting data outputted from an optical coupler in the form of an analog signal into digital data and then, resetting a reference recognizing level stored within a MPU according to the converted data.

In one embodiment of the present invention, a method for detecting data outputted from an optical coupler is presented, comprising the steps of setting a reference recognizing level by inputting the data in an initial state to an A/D converter; recognizing the level of the data in a non-initial state as high if the level of the data at the non-initial state is greater than the reference recognizing level; recognizing level of the data in the non-initial state as low if the level of the data at the non-initial state is less than the reference recognizing level; and setting the level of the data at the non-initial state to equal the reference recognizing level if the level of the data at the non-initial state is recognized as low.

In a second embodiment of the present invention, a method for detecting data outputted from an optical coupler is presented, comprising the steps of setting a reference recognizing level; inputting the data to an A/D converter to determine a level for the data; determining whether the difference between the level of the data and the reference recognizing level is greater than a predetermined value; recognizing the level of the data as high if the difference is greater than the predetermined value; and recognizing the level of the data as low if the difference is less than the predetermined value. The step of setting the reference recognizing level includes inputting the data at an initial state through the A/D converter.

BRIEF DESCRIPTION OF THE DRAWINGS

These and various features and advantages of the present invention will be readily understood with reference to the following detailed description taken in conjunction with the accompanying drawings, in which.

DETAILED DESCRIPTION OF THE PREFERRED EMBODIMENTS

Figure 1:
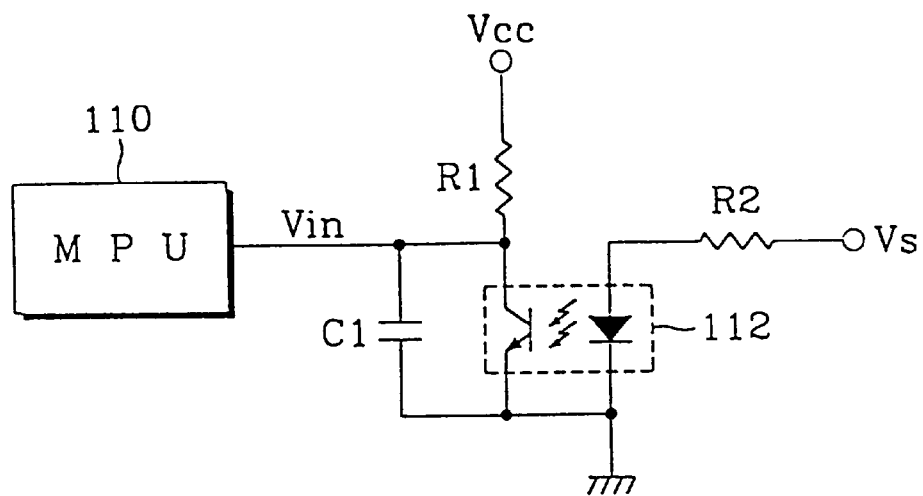
FIG. 1 is a schematic illustrating a prior art optical coupler circuit.
Figure 2:
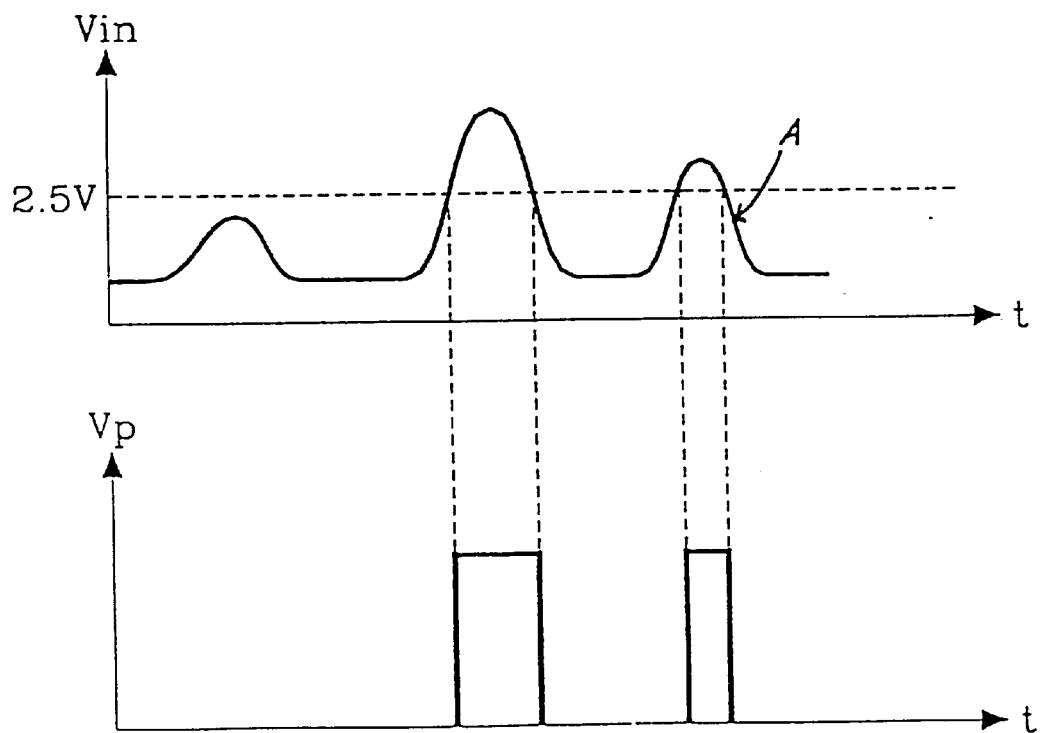
FIG. 2 illustrates in graphic form the detection of data outputted from the prior art coupler.

Preferred embodiments of a method for detecting data outputted from an optical coupler by the use of an analog/ digital converter will now be described with reference to the drawings, in which like reference numerals designated identical corresponding elements in each of the several views.

Figure 3:
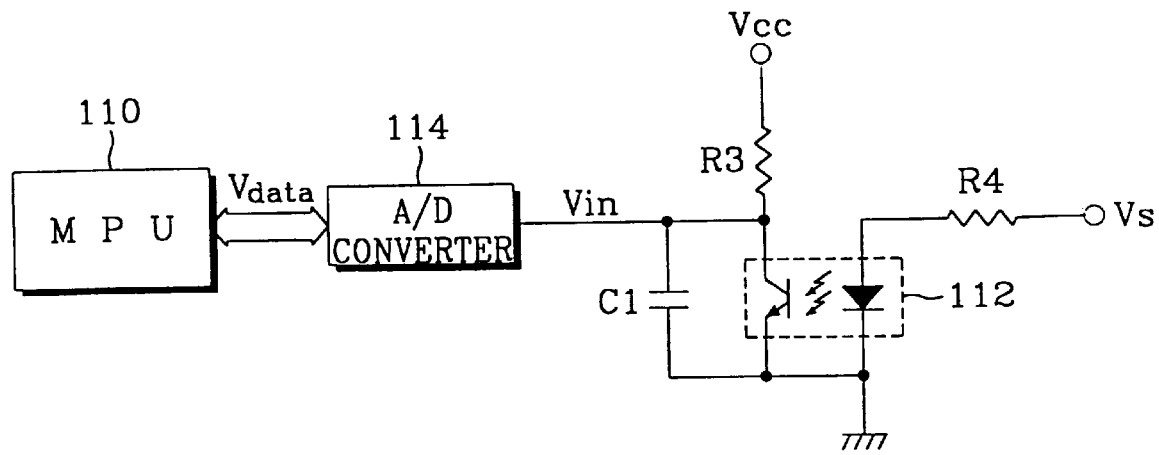
FIG. 3 is a schematic illustrating an optical coupler circuit according to a first embodiment of the present invention.

A schematic illustrating an optical coupler circuit according to a first embodiment of the present invention is shown in FIG. 3. An A/D converter 114 converts an output signal Vin outputted from an optical coupler 112 into an 8-bit digital data. The MPU 110 analyzes the 8-bit digital data inputted from the A/D converter 114 to determine the level of the input signal over time, depending on the resolution and setting of the A/D converter. It is contemplated that the A/D converter 114 can be situated within the MPU 110 or can be mounted to the exterior of the MPU 110.

Figure 4:
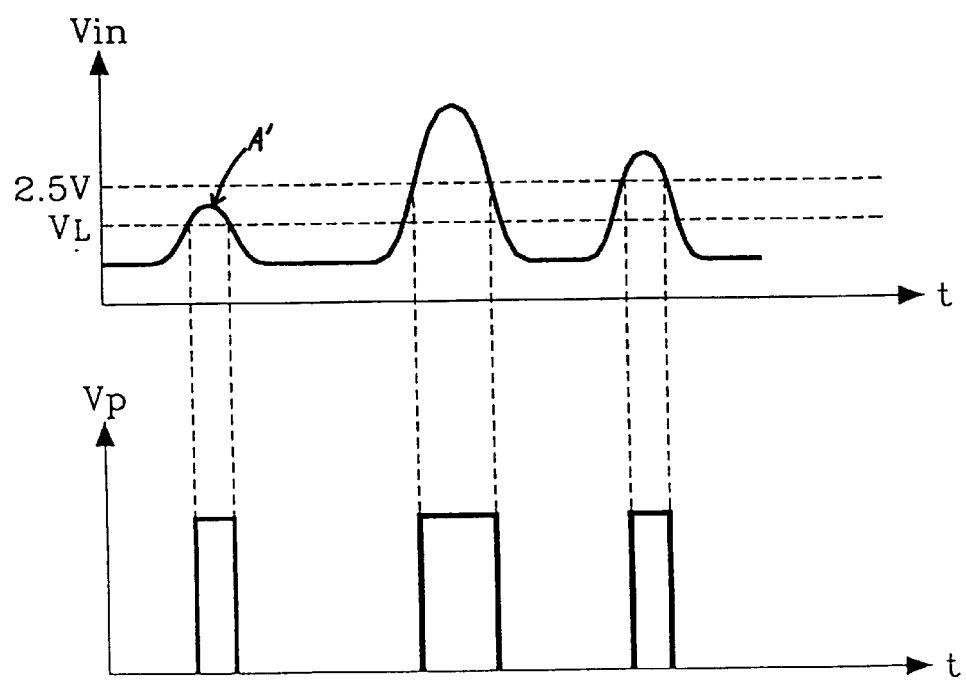
FIG. 4 illustrates in graphic form the detection of data outputted from the optical coupler circuit according to the first embodiment of the present invention.

FIG. 4 illustrates in graphic form the detection of data outputted from the optical coupler circuit according to the first embodiment of the present invention. A digital data signal Vp corresponding to the output analog signal Vin is recognized by the MPU 110. The digital data signal Vp is outputted from the A/D converter and it is an 8-bit data stream $V_{data}$ which is inputted to the MPU 110. The MPU 110 recognizes the level of the bits of $V_{data}$ as high or low using a reference recognizing level $V_{ref}$. $V_{ref}$ may be reset in order for the MPU 110 to correctly recognize the level of a bit. For example, in FIG. 4 point A' of the signal Vin is below the reference recognizing level, i.e., 2.5V, and the reference recognizing level is reset to $V_L$. As a result, the MPU 110 correctly recognizes point A' of signal Vin as having a logic high level, even though point A' has a level less than the originally set reference recognizing level. The reference recognizing level is never set below the logic low level.

Figure 5:
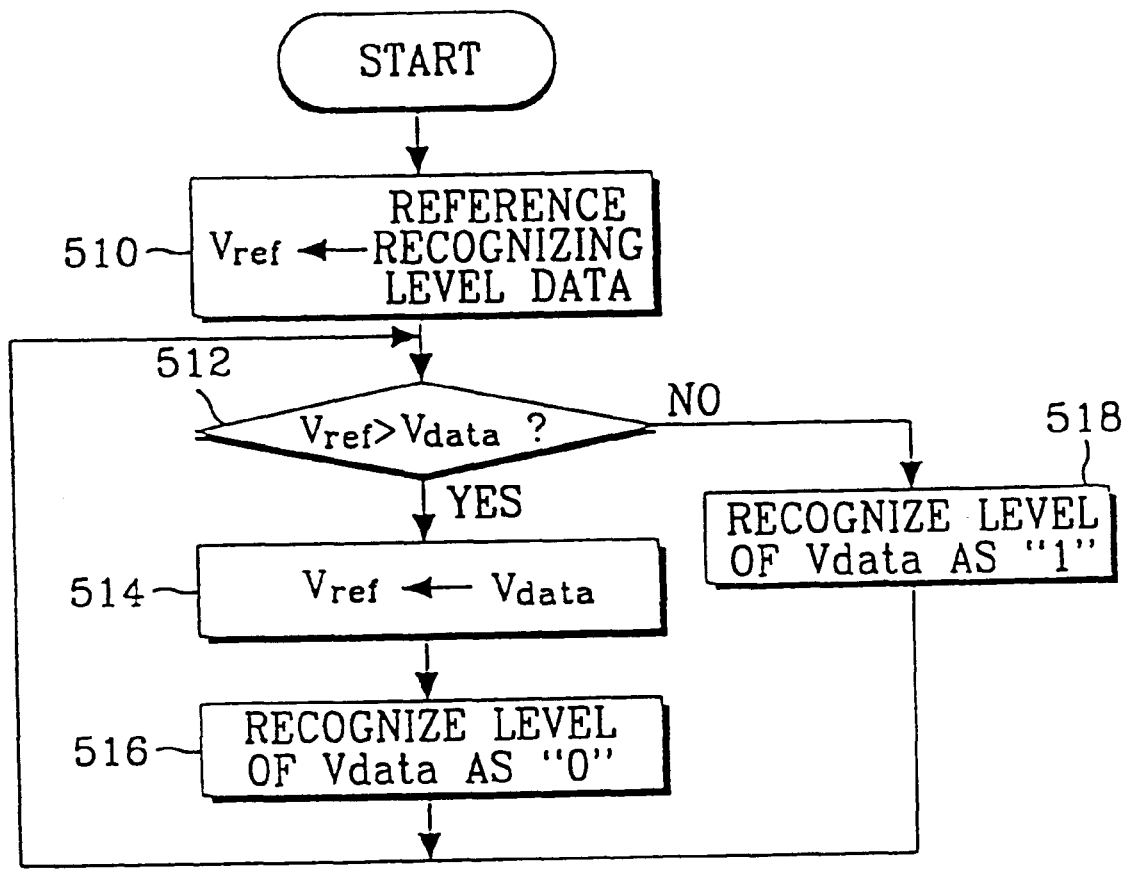
FIG. 5 is a flow chart illustrating the method of operation of the optical coupler circuit of the first embodiment.

FIG. 5 is flow chart illustrating the method of operation of the optical coupler circuit of the first embodiment. The method comprises the steps of: receiving data at an initial state having a level corresponding to a reference recognizing level; storing the level of the received data at the initial state as the reference recognizing level; determining whether the reference recognizing level of the received data at a non-initial state is less than the reference recognizing level; recognizing the level of the received data at the non-initial state to be low if the reference recognizing level of the received data at the non-initial state is less than the reference recognizing level and storing the reference recognizing level of the received data at the non-initial state as the reference recognizing level; and recognizing the level of the received data at the non-initial state to be high if the reference recognizing level of the received data at the non-initial state is greater than the reference recognizing level.

Referring to FIG. 5, in step 510 the MPU 110 receives and stores the level of the data at an initial state as the reference recognizing level $V_{ref}$. In step 512, the MPU 110 compares the level of data outputted from the A/D converter 114 with the reference recognizing level $V_{ref}$. If it is determined in step 512 that the level of $V_{data}$ is less than the reference recognizing level Vref, the MPU 110 proceeds to step 514. In step 514, the MPU 110 stores the level of the inputted $V_{data}$ as the reference recognizing level $V_{ref}$ and the method proceeds to step 516 where the level of $V_{data}$ is recognized as a logic low level. However, if it is determined in step 512 that the level of $V_{data}$ is greater than the reference recognizing level $V_{ref}$, the MPU 110 proceeds to step 518. In step 518, the MPU 110 recognizes the level of $V_{data}$ as a logic high level.

Figure 6:
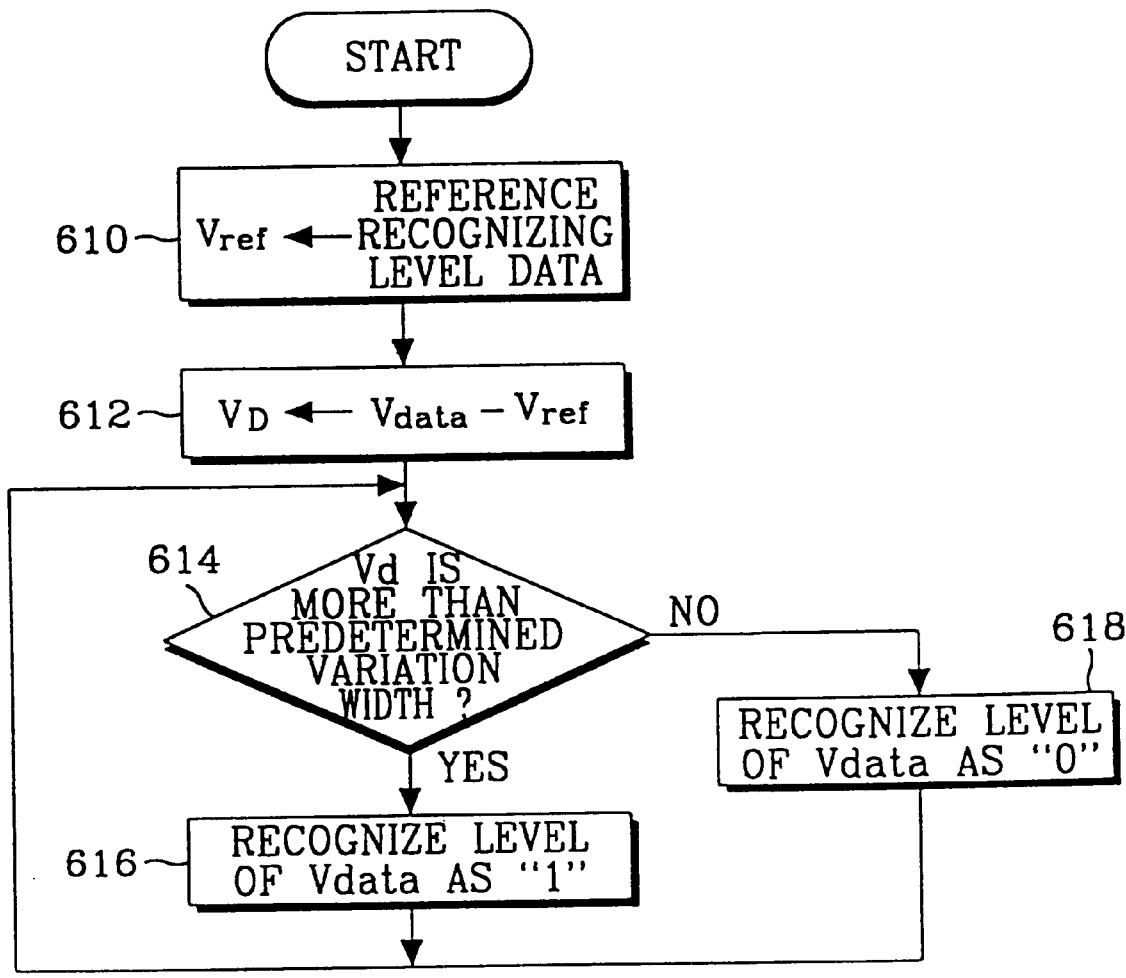
FIG. 6 is a flow chart illustrating the method of operation of an optical coupler circuit of a second embodiment.

Another preferred embodiment of the present invention will be described in detail with reference to FIG. 6. FIG. 6 is a flow chart illustrating the method of operation of the optical coupler circuit of a second embodiment. The method comprises the steps of: receiving data at an initial state; storing the level of the received data at the initial state as the reference recognizing level; determining whether the difference between the level of the received data at a non-initial state and the reference recognizing level is greater than a predetermined value; recognizing the level of the received data at the non-initial state to be high if the difference between the received data at the non-initial state and the reference recognizing level is greater than the predetermined value; and recognizing the level of the received data at the non-initial state to be low if the difference between the received data at the non-initial state and the reference recognizing level is less than the predetermined value. The predetermined value is a given level of voltage value stored within the MPU 110 for comparing the reference recognizing level and the level of the received data at the non-initial state.

Referring to FIG. 6, in step 610 the MPU 110 stores the reference recognizing level as $V_{ref}$. An operator can store the reference recognizing level $V_{ref}$ as the level of data at an initial state, i.e., at a state where there are no input signals. In step 612, the MPU 110 determines the difference between the level of $V_{data}$ provided from the A/D converter 114 and the reference recognizing level $V_{ref}$. The difference between the $V_{data}$ and the reference recognizing level $V_{ref}$ is referred to as $V_D$. The MPU 110 in step 614 checks whether $V_D$ is greater than the predetermined value. If it is determined in step 614 that $V_D$ is greater than the predetermined value, the MPU 110 proceeds to step 616, where the level of $V_{data}$ is recognized to be high. However, if the level of $V_D$ is less than the predetermined value, the MPU 110 proceeds to step 618, where the level of $V_{data}$ is recognized to be low.

As it is apparent from FIGS. 5 and 6, the reference recognizing level is changed recursively according to the instable output of the optical coupler 112, in order for the present invention to stably recognize the input signal Vs even though the high level of the signal Vs can deviate substantially during an application.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiments disclosed as the best mode contemplated for carrying out the present invention, but that the present invention includes all embodiments falling within the scope of the accompanying claims.

What is claimed is:

1. A method for detecting analog data outputted from an optical coupler, comprising the steps of:

setting a reference recognizing level;

inputting said data to an A/D converter to output a digital level for said data;

determining whether the difference between the level of said data and said reference recognizing level is greater than a predetermined value;

recognizing the level of said data as high if said difference is greater than the predetermined value; and recognizing the level of said data as low if said difference is less than the predetermined value.

2. The method according to claim 1, wherein the step of setting the reference recognizing level includes inputting said data at an initial state through said A/D converter, to produce a digital reference recognizing level.

3. The method according to claim 1 further comprising the step of selecting the predetermined value before the determining step, the predetermined value being a given level of voltage value for comparing the level of said data and said reference recognizing level.

4. A system for detecting analog data outputted from an optical coupler, comprising:

a processor for setting a reference recognizing level; and an A/D converter for receiving said data to output a digital level for said data, wherein said processor determines whether the difference between the level of said data and said reference recognizing level is greater than a predetermined value, recognizes the level of said data as high if said difference is greater than the predetermined value and recognizes the level of said data as low if said difference is less than the predetermined value.

5. A system according to claim 4, wherein said processor sets the reference recognizing level by inputting said data at an initial state through said A/D converter to produce a digital reference recognizing level.

6. A system according to claim 4, wherein said predetermined value is a given level of voltage value for comparing the level of said data and said reference recognizing level.

* * * * *